United States Patent
Bishay et al.

(10) Patent No.: US 6,534,796 B1
(45) Date of Patent: Mar. 18, 2003

(54) INTEGRATED CIRCUIT OPTICS ASSEMBLY UNIT

(75) Inventors: Magued Bishay, Costa Mesa, CA (US); Randall M. Chung, Laguna Niguel, CA (US); James K. Dawson, La Cañada, CA (US); David Escobar, San Juan Capistrano, CA (US); Mike Fukatsu, La Mirada, CA (US); Edward Andrew Jakl, Tustin, CA (US); Sarit Neter, Irvine, CA (US); Ian Olsen, Irvine, CA (US); Gregory A. Urban, Las Flores, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/408,810

(22) Filed: Sep. 29, 1999

(51) Int. Cl.⁷ .......................... H01L 27/15; H01L 31/12; H01L 27/14
(52) U.S. Cl. .............................. 257/80; 257/81; 257/84; 257/414
(58) Field of Search .............................. 257/414, 80, 81, 257/82, 83, 84, 431, 434

(56) References Cited

U.S. PATENT DOCUMENTS 5,166,755 A * 11/1992 Gat .............................. 356/419
5,340,978 A * 8/1994 Rostoker et al. ............ 250/208.1
5,686,990 A * 11/1997 Laznicka, Jr. ................ 356/350
6,057,925 A * 5/2000 Anthon ........................ 356/419

FOREIGN PATENT DOCUMENTS

JP          07009698      *  1/1995  .............. B41J/2/44

* cited by examiner

Primary Examiner—Matthew Smith
Assistant Examiner—Igwe Anya
(74) Attorney, Agent, or Firm—Akin Gump Straus Hauer & Feld LLP

(57) ABSTRACT

A semiconductor component that receives incoming light includes an integrated circuit, a package and an optics unit. The optics unit may provide a pathway, either generally or selectively, for the incoming light to the photodetector circuitry of the integrated circuit and may modify the incoming light, as well. The optics unit may be either electrically active or passive. When active, the optics unit is coupled to the integrated circuit with a conductor. The optics unit may also include a liquid crystal device, a beamsplitter assembly, a lensing assembly or other filters, and/or apertures. The liquid crystal device can act as a shutter or a display and the optics unit may be a single module or a plurality of modules. The integrated circuit may also include shutter drive circuitry and image processing circuitry.

26 Claims, 9 Drawing Sheets

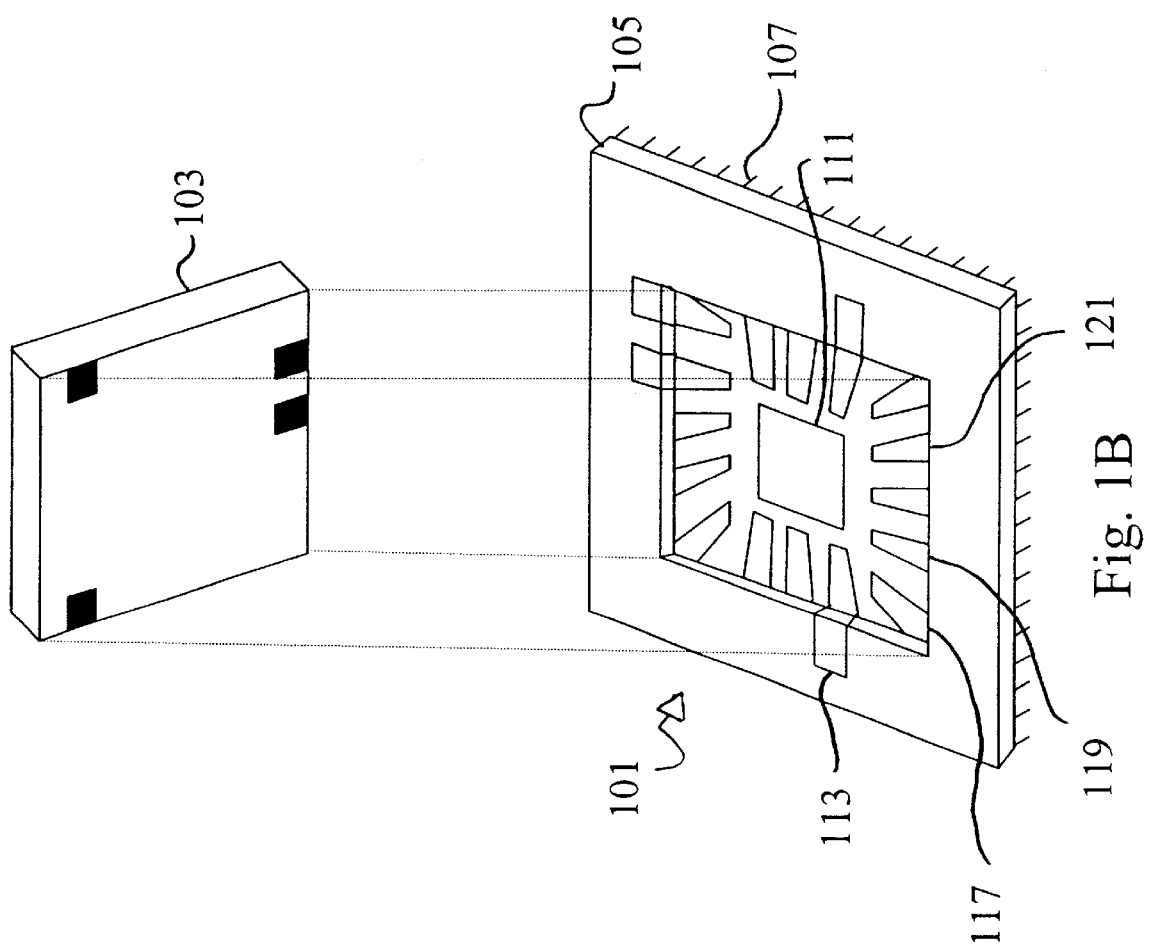

INTEGRATED CIRCUIT OPTICS ASSEMBLY UNIT

BACKGROUND OF THE INVENTION

1. Technical Field

The present invention relates generally to integrated circuit photodetector arrays and optics assemblies; and, more particularly, it relates to the packaging of integrated circuit photodetector arrays, associated circuitry, and optics assemblies in a single unit.

2. Related Art

Optical assembly selection and alignment are important considerations for any product that includes a photodetector assembly. Optical assemblies that may be used typically include lensing systems, shutters, apertures, beam-splitters, filters, photodetector arrays, etc. Conventional photodetector arrays, e.g., CCD (Charge Coupled Device) or CMOS (Complementary Metal Oxide Semiconductors Imagers) have differing resolutions, die sizes, and packaging orientations. Unfortunately, when designing a product using these arrays, electrical and mechanical engineers with minimal optics backgrounds are often required to select lens and/or shutter assemblies.

The photodetector arrays in conventional systems are easily bumped, bent or otherwise moved out of alignment. A designer must pay close attention to the optical alignment of these arrays and may not realize when and if a particular array is misaligned. The imager quality in a misaligned system will be severely compromised.

With traditional imaging products, a number of components must be interfaced and mounted on a circuit board. This typically requires the combined efforts of engineers that are familiar with the optical, electrical and mechanical aspects of the products. The successful interfacing of these various components and engineering disciplines is, at best, problematic and, at worst, prohibitive. The designer(s) must resolve all of the intricacies of each component and accurately predict the interaction there between.

Standard imaging products often use components used in displays, display driver circuitry, processing circuitry and a combination of arrays and imagers. Each of these components occupies considerable space and consumes additional power.

Conventional imaging products also typically require some form of shuttering mechanism. The shuttering mechanism that is routinely employed is a mechanical shutter that has considerable drawbacks in terms of size, power consumption and flexibility of operation. The mechanical shutter is ordinarily a separate component that increases the size and complexity of the imaging product. The shutter generally requires its own shutter drive circuitry, processing circuitry, memory circuitry and photodetector arrays. The alignment of the shutter with the other components again presents a problem for the designer(s).

An additional feature of conventional optical assemblies is the addition of color filters to process light. These color filters typically cannot process more than one type of light simultaneously nor can the filters regulate the intensity of the light that passes through the filters. Such optical assemblies also occupy considerable space due to the required placement of the filters.

Many other problems and disadvantages of the prior art will become apparent to one skilled in the art after comparing such prior art with the present invention as described herein.

SUMMARY OF THE INVENTION

Various aspects of the present invention can be found in a semiconductor component that receives incoming light. The semiconductor component comprises an integrated circuit, a package and an optics unit. The optics unit is disposed on the package that houses the integrated circuit. The optics unit may provide an optical pathway for the incoming light to the photodetector circuitry of the integrated circuit. The optics unit may modify the incoming light in the optical pathway to the photodetector circuitry. Alternatively, the optics unit may selectively provide such optical pathway or interact in some manner with the integrated circuit.

The optics unit may be either electrically active or passive. When active, a conductor may couple the optics unit with the integrated circuit. Depending on the specific implementation, the optics unit may, for example, comprise beamsplitter assemblies, lensing assemblies, filters and/or apertures. The optics unit may also comprise a liquid crystal device, which may act as a shutter or a display. The optics unit may be a single module or a plurality of modules. Also, depending on the specific implementation, the integrated circuit may also comprise shutter drive circuitry and image processing circuitry.

Other aspects of the present invention will become apparent with further reference to the drawings and specifications which follow.

BRIEF DESCRIPTION OF THE DRAWINGS

FIG. 1B is a cut-away view of the semiconductor component of FIG. 1A that demonstrates the bonding and alignment of the lid in relation to a die below.

DETAILED DESCRIPTION OF THE PREFERRED EMBODIMENTS

Figure 1A:
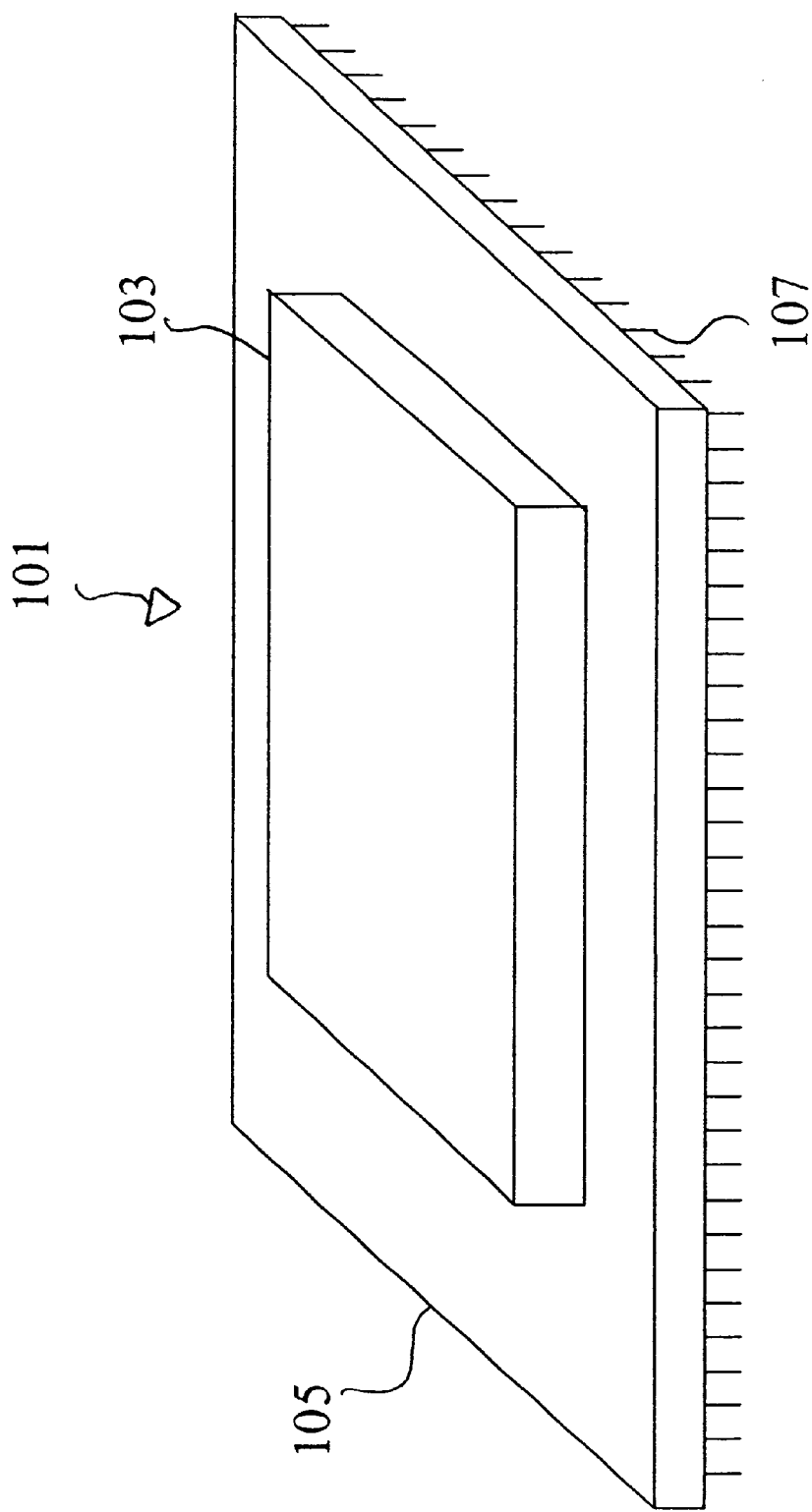
FIG. 1A is a perspective view of a semiconductor component built in accordance with the present invention.

FIG. 1A is a perspective view of a semiconductor component built in accordance with the present invention. Specifically, a semiconductor component 101 comprises an optics unit 103 that is mounted or otherwise affixed to a package 105. The package 105 is typically a chip carrier, leadframe or surface mount carrier, for example, made of plastic and/or ceramic. The package 105 will generally contain a plurality of leads, such as a lead 107, disposed beneath the package.

The packaging of the optics unit 103 is such that a die (an "integrated circuit") located within the package 105 has direct optical, and in some embodiments electrical, access to the optics unit 103. The packaging of the semiconductor component 101 provides for hermetic sealing, as well as optical alignment of the optics unit 103 and the underlying die.

FIG. 1B is a perspective view of the general optical assembly structure that illustrates the bonding and alignment of the optics unit in relation to the die and package. In particular, the diagram shows a cut-away view of the optics unit 103 lifted away from the package 105 to show the interface between the optics unit 103 and an integrated circuit, i.e., a die 111. This figure demonstrates the use of a plurality of power supply lines or pads 113 that are connected to a plurality of bond wires 115 to allow the optics unit 103 to be operated to draw power via powerpins of the leads 107 in an active mode. At least one ground line 117 is typically included, as well. The optics unit 103 is electrically active and, accordingly, can be powered up or powered down for a particular application.

Although illustrated as operating in an active mode, the optics unit 103 can be manufactured to operate in a passive mode. The semiconductor component could also be built with the power supply lines 113 and include switching circuitry that would allow the unit to be operated in either active or passive mode. In addition to the power supply lines 113, the semiconductor component could include a plurality of control lines 119 and interface lines 121.

The plurality of power supply lines 113, control lines 119 and interface lines 121 are connected to the plurality of bond wires 115. The arrangement of the power supply lines or pads 113 and vertically stacked control and interface functionality allows for reduction of the number of leads 107 and the size of the optics unit 103.

Figure 1C:
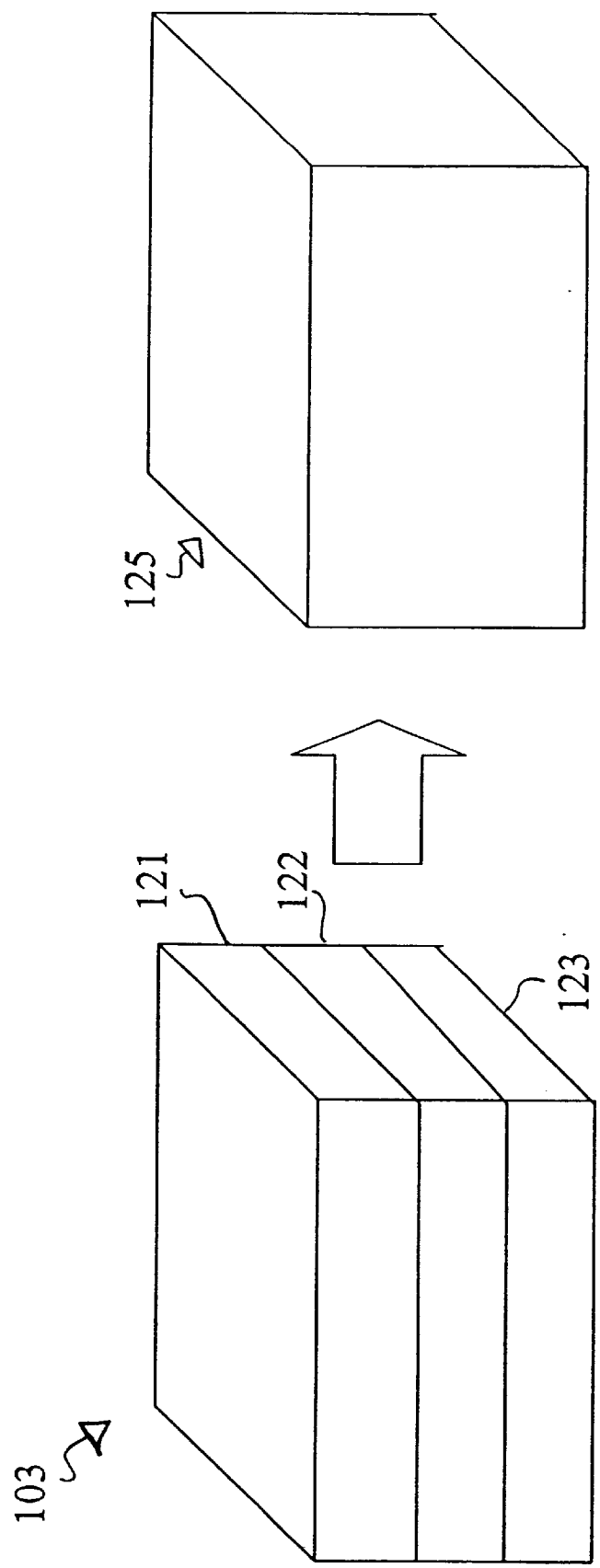
FIG. 1C is a perspective view of a multi-stage semiconductor component built in accordance with the present invention.

FIG. 1C is a perspective view of the multi-stage semiconductor component built in accordance with the present invention, illustrating the use of a plurality of optics assemblies 103. The additional optics assemblies are typically stacked one atop the other and can be stacked in varying numbers. This arrangement provides considerable versatility and flexibility for a designer. Each of the optics units 103 can perform a variety of functions and contain a multitude of features.

The optics units can include filters, polarizers, apertures, reflectors or refractors based on the needs of a particular application. The optics units themselves can perform, for example, beamsplitting, lensing, display, and/or shuttering functions. Increased complexity can be achieved by combining such functionality into a single module or by placing such functionality into several modules that optically and electrically align in a stacked arrangement as the optics unit 103. For example, a stack of optics units could contain a module 121 comprising an active beamsplitter assembly, a module 122 comprising a shuttering assembly and a module 123 comprising a display capability, aligned so as to form a single stacked assembly 125. Because the stack of optics units is in optical alignment, a specific optics unit can be added, removed or modified without any loss in optical resolution to the entire optics assembly.

The optics unit 103 can be a single module or a set of optics modules connected to form a single unit 125. In a structure containing several optics modules, the modules will typically be disposed one atop the other into a single optics unit 103 and then affixed to the package 105. The optics assembly units can each be of varying types and perform various functions. For example, any of the optics assembly units can be either active or passive, be hermetically sealed to the other units or not, and can contain additional filters, polarizers, reflectors, lensing assemblies, beamsplitters or other features. The optics assembly units are at all times maintained in optical alignment, thereby allowing for the addition, deletion or modification of the units in a given stack without any loss or degradation in optical quality.

Figure 2A:
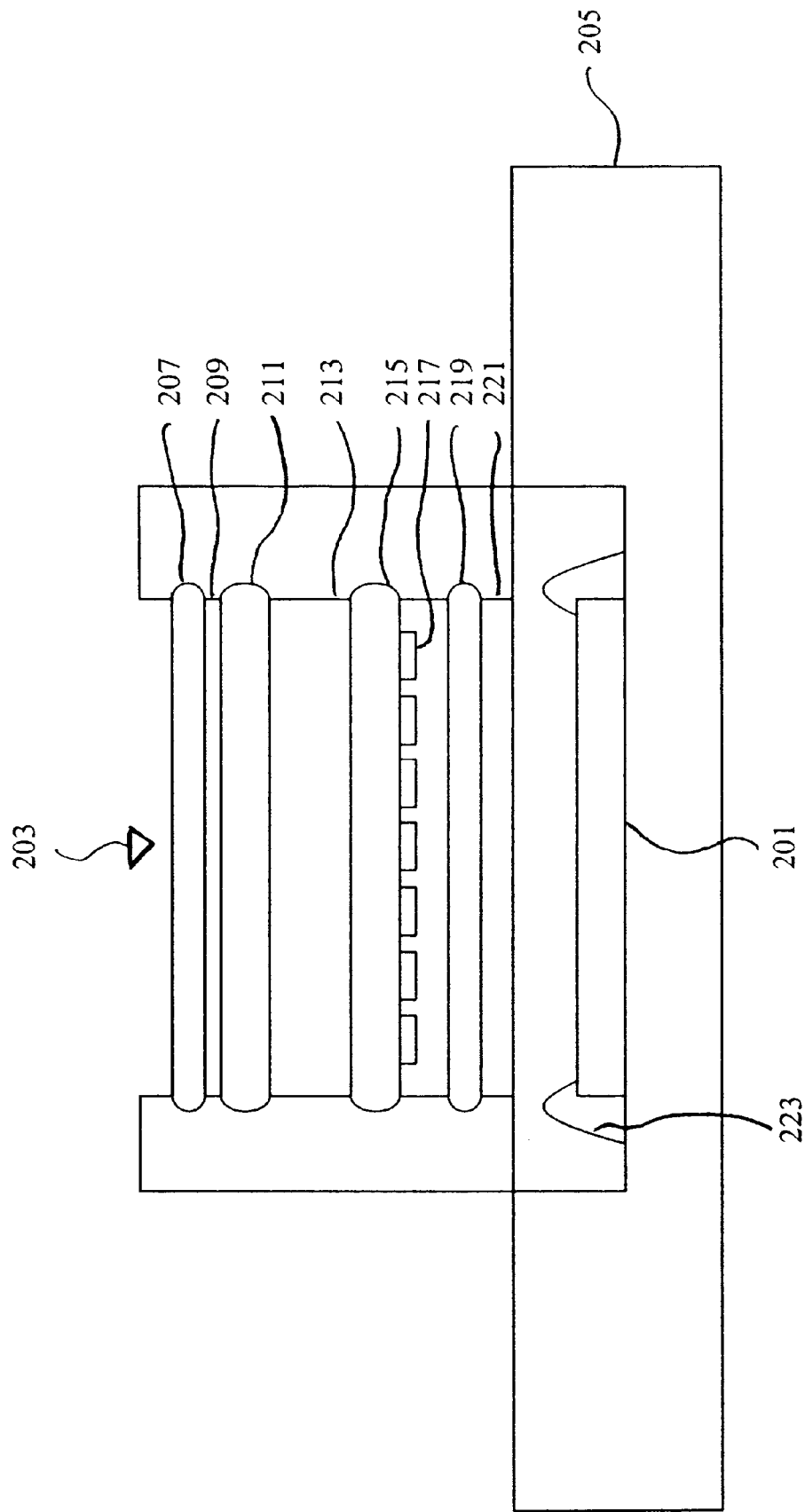
FIG. 2A is a perspective, partial cut-away view of a specific embodiment of the semiconductor component of FIGS. 1A–1B wherein the optics assembly unit includes a plurality of photodetector arrays, filters and polarizers.

FIG. 2A is a cut-away view of an embodiment of the semiconductor component of FIG. 1A wherein the optics unit includes a plurality of photodetector arrays, filters and polarizers. The optics unit of FIG. 2A additionally includes a layer of transparent conductor oxide, a plurality of glass layers and a liquid crystal panel. The optics unit can also contain an active thin film transistor ("TFT") array and typically contains a seal to the package.

In particular, a die 201 is mounted in a package 205, and is electrically coupled to the package 205 through a plurality of bond wires 223. An optics unit 203 is affixed to the package 205 in alignment with the die 201. Various optical imaging elements comprise the optical unit, and are disposed in optical alignment within the optics unit 203. The optics unit 203 comprises a first polarizer 207, a layer of transparent conductor oxide 209, a first layer of glass 211, a liquid crystal panel 213, a second layer of glass 215, a plurality of active thin film transistor ("TFT") arrays 217, a second polarizer 219 and a seal 221, each disposed in optical alignment atop the die 201 and mounted in the package 205. The liquid crystal panel 213 can be a liquid crystal display or a liquid crystal shutter.

Figure 2B:
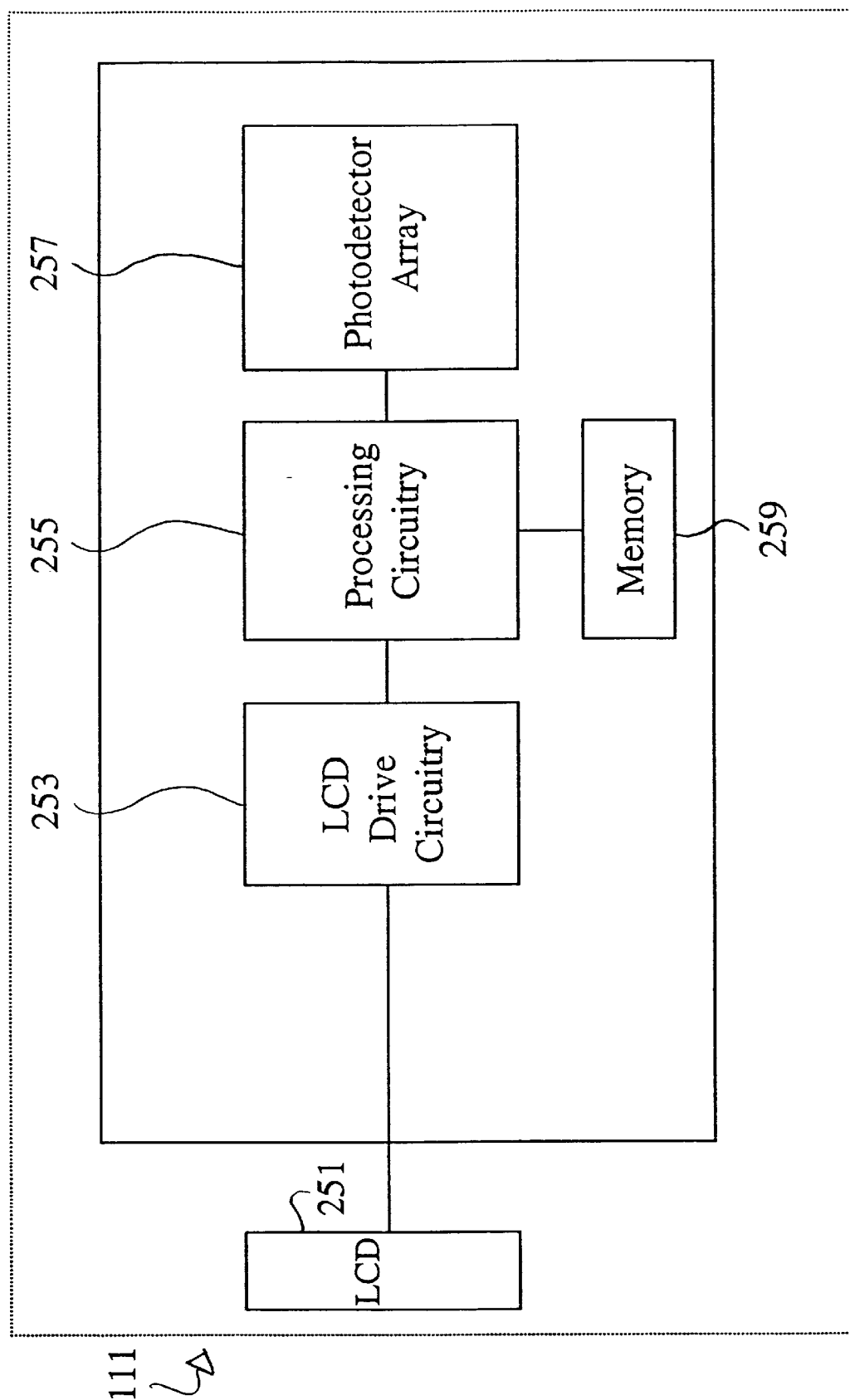
FIG. 2B is a schematic block diagram of an embodiment of the component parts underlying the semiconductor component of FIG. 2A.

FIG. 2B is a schematic block diagram of an embodiment of the component parts underlying the semiconductor component of FIG. 2A. The block diagram illustrates the integration of a liquid crystal panel 251, liquid crystal display ("LCD") drive circuitry 253, processing circuitry 255, a photodetector array 257 and a memory 259 within a single semiconductor component 111. Depending upon the needs of a particular application, the semiconductor component 111 can contain any or all of these elements.

The liquid crystal panel 251 is an LCD that operates both as a display and as a shutter. The liquid crystal panel 251 operates as a shutter to assist in the capture of images which may thereafter be displayed on the panel 251.

When operating as a shutter, the shutter drive circuitry 253 can be selected to provide a variety of shutter speeds and exposure times and be programmed to store, adjust and modify these parameters based on the static and dynamic requirements of a particular application. Of course, the liquid crystal panel 251 may only operate as an LCD or only as a shutter depending on system requirements.

The processing circuitry 255 can also be programmed to store and execute the parameters for a particular application. The processing circuitry can capture images from a variety of image processing schemes, including well-known and wide-spread JPEG ("Joint Photographic Experts Group") and MPEG ("Moving Pictures Experts Group") image compression schemes for the delivery of compressed images and/or streaming video. The processing circuitry can be used to complement and support various audio/visual applications, including cameras, VCR's ("video cassette recorders"), laser discs, compact discs and combinations of these and other applications.

The memory circuitry 259 can be arranged in various forms and sizes, as well. The memory 259 interfaces with the processing circuitry 255 in order to store, index and modify the processing requirements and parameters for a particular application.

The processing circuitry can also be programmed to process either color or black and white images or both. This circuitry can also be selected so as to provide for the capture of one or several images at one time. The images can be "streamed" to provide a motion picture effect or can be captured in a single image or "still picture" format.

Although not necessary, the semiconductor component includes a photodetector array 257. The photodetector array can be in the form of a single array or a plurality of arrays. The photodetector arrays can be disposed between a plurality of filters, polarizers or layers of glass or plastic. Additionally, there can be several optics modules forming the optics unit. The filters can be of various types, for example, an array of colors, e.g., red, green, blue, ultraviolet or infrared.

Figure 3A:
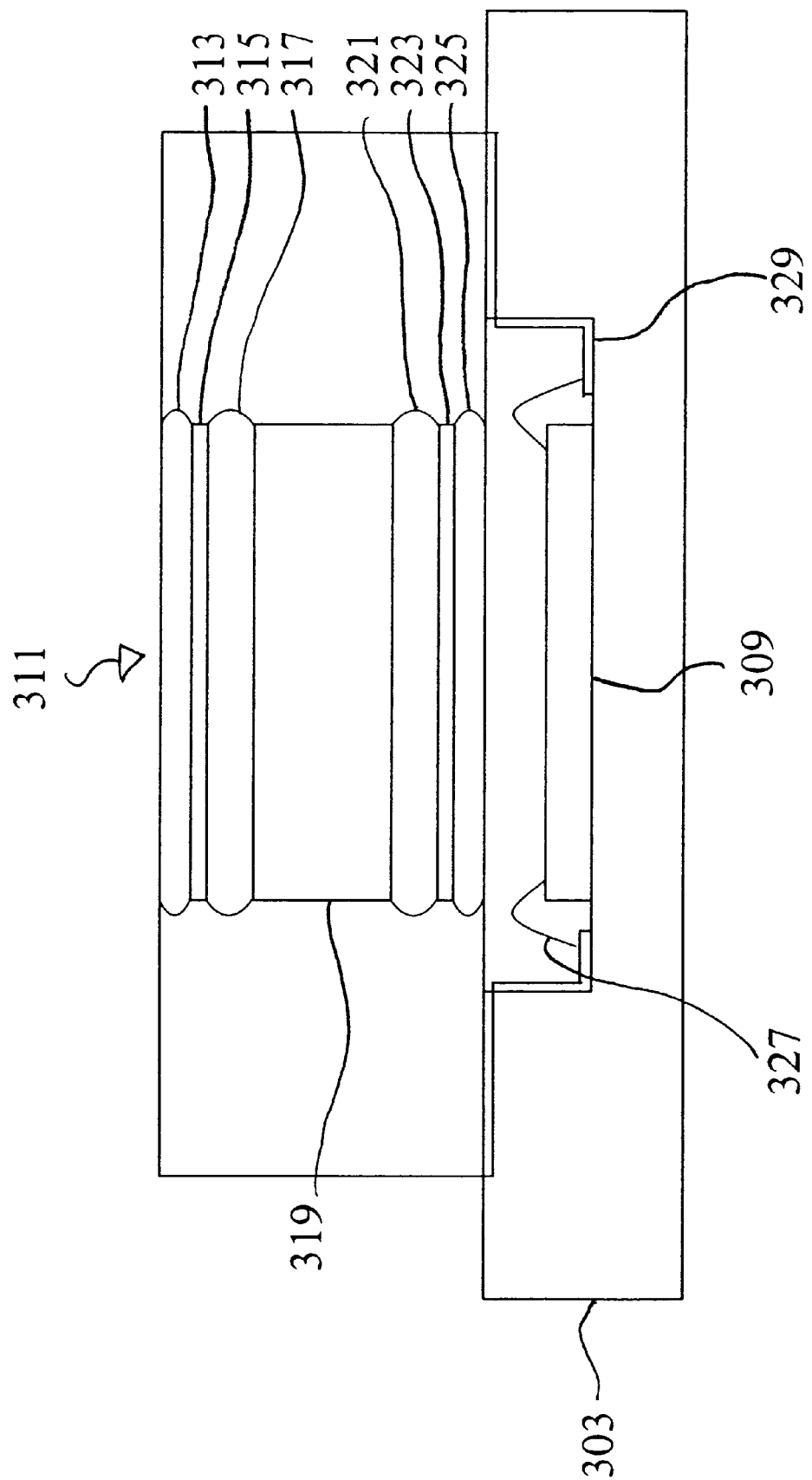
FIG. 3A is a perspective, partial cut-away view of a specific embodiment of the semiconductor component of FIGS. 1A–1B wherein the optics assembly unit includes a liquid crystal shutter.

FIG. 3A is a perspective, cut-away view of a specific embodiment of the semiconductor component of FIGS. 1A–1B wherein the optics unit includes a liquid crystal shutter. The optics unit comprises layers of polarizers, oxides and glass above and below the liquid crystal shutter itself. The entire optics unit is mounted atop a package in alignment with the die. The package also contains conductors to interface between a plurality of bond wires and a plurality of power supply, control and interface lines to the die itself. Use of the liquid crystal shutter eliminates the power drain of a conventional mechanical shutter.

More specifically, an optics unit 311 is affixed to a package 303 in optical alignment with a die 309. The optics unit 311 comprises a first polarizer 313, a first layer of transparent conductor oxide 315, a first layer of glass 317, a liquid crystal shutter 319, a second layer of glass 321, a second layer of transparent conductor oxide 323 and a second polarizer 325. The package contains a plurality of bond wires 327 and a plurality of conductors 329, the conductors 329 designed to connect, for example, power supply, control and/or interface lines via the bond wires 327.

The shutter is programmed to operate at a variety of speeds and exposure times, which are modified and manipulated with shutter drive circuitry. The various settings for the shutter are then stored in a memory. The memory is a single unit or, in some embodiments, a plurality of units. Memory circuitry is included to interface with any and all of the component parts of the semiconductor component, that is, independent memory units interface with the shutter drive circuitry, the processing circuitry or photodetector arrays.

Figure 3B:
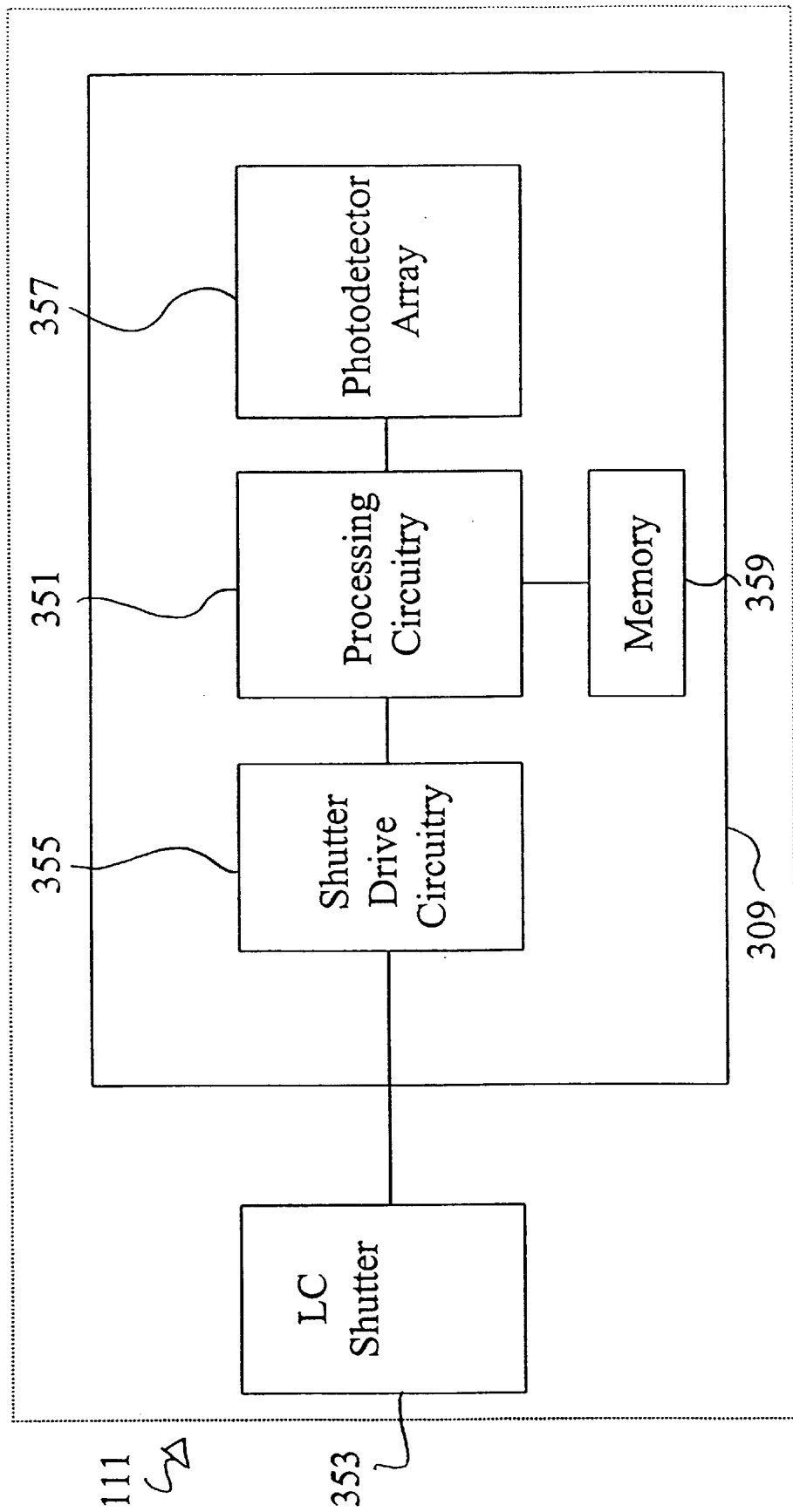
FIG. 3B is a schematic block diagram of an embodiment of the component parts underlying the semiconductor component of FIG. 3A.

FIG. 3B is a schematic block diagram of an embodiment of the component parts underlying the semiconductor component of FIG. 3A. The block diagram illustrates the integration of a liquid crystal ("LC") shutter 353, shutter drive circuitry 355, processing circuitry 351, a photodetector array 357 and a memory 359 within a single semiconductor component 111. Depending upon the needs of a particular application, the semiconductor component 111 can contain any or all of these elements.

The LC shutter captures images which can then be stored or otherwise processed by the semiconductor component circuitry. The shutter drive circuitry 355 can again be selected to provide a variety of shutter speeds and exposure times and be programmed to store, adjust and modify these parameters based on the static and dynamic requirements of a particular application.

The processing circuitry 351 can be programmed to store and execute the parameters for a particular application. The processing circuitry can capture images from a variety of image processing schemes for the delivery of compressed images and/or streaming video and can be used to complement and support various audio/visual applications.

The memory circuitry 359 interfaces with the processing circuitry 351 in order to store, index and modify the processing requirements and parameters for a particular application. The processing circuitry can also be programmed to process color images, black and white images or both. The captured images can be "streamed" to provide a motion picture effect or captured in "still picture" format.

At the option of the user, the semiconductor component can include a photodetector array 357, which can be in the form of a single array or a plurality of arrays. The photodetector arrays can be disposed between a plurality of filters, polarizers or layers of glass or plastic. There can be several optics modules forming the optics unit.

In some embodiments, the system is realized with two separate elements, namely, a separate LC shutter 353 and an integrated circuit 309 that integrates the shutter drive circuitry 355, the processing circuitry 351, the photodetector array 357 and the memory 359.

Figure 4A:
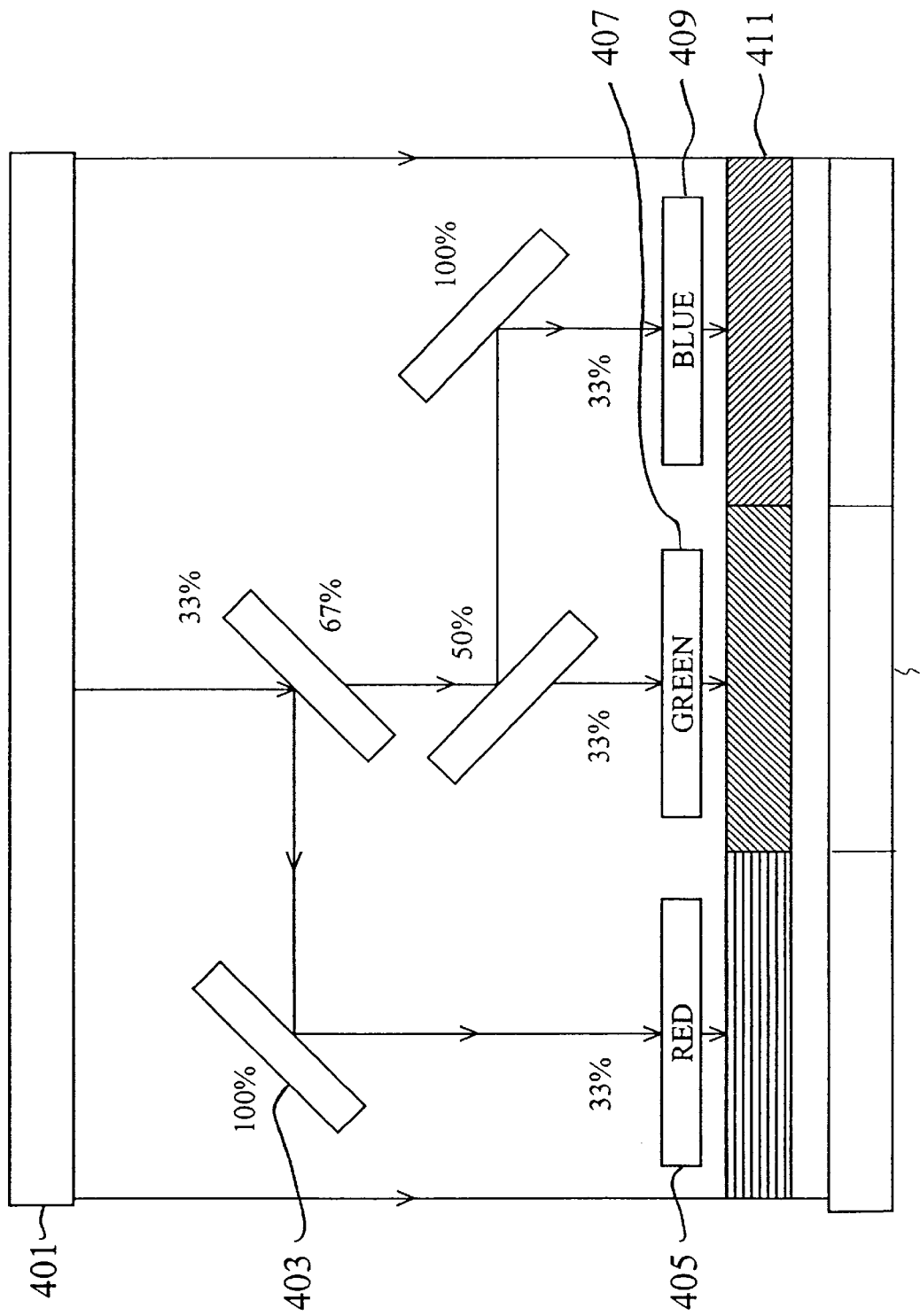
FIG. 4A is a cross-sectional view of a specific embodiment of the semiconductor component of FIGS. 1A–1B wherein the optics assembly unit is a beamsplitter assembly.

FIG. 4A is a cross-sectional view of an alternate embodiment of the semiconductor component of FIGS. 1A–1B wherein the optics unit is a beamsplitter assembly. A liquid crystal display shutter 401 is positioned atop a plurality of mirrors 403, where the mirrors are positioned to reflect incident light in various proportions and intensities. FIG. 4A shows an embodiment of the present invention in which the incident light is reflected from the mirrors 403 through a red filter 405, a green filter 407 and a blue filter 409. After the reflected light passes through the colored filters, it strikes a three-segment shutter 411 before being introduced to a plurality of photodetector arrays 421 located below the three-segment shutter 411.

A variety of optical components could be positioned atop the beamsplitter assembly either singularly or in combination with other optical components. The components can easily be added, removed or modified because the entire semiconductor component is manufactured so as to be in optical alignment. For example, the liquid crystal shutter could be replaced with a lensing assembly, which itself could be adjustable.

The mirrors or other reflective surfaces can also be positioned, modified, added or removed to suit a variety of applications. The surfaces can be selected to reflect or refract either all or a portion of the incident light.

Similarly, additional components could be added beneath the three-segment shutter 411. For example, a liquid crystal panel, a liquid crystal display or plurality of liquid crystal displays could be added to display the results of the beamsplitter assembly's filtering of the incident light. These features could be incorporated into both analog and digital cameras, VCR's, compact and laser disc players and other audio/visual applications.

The beam-splitter assembly allows red, green and blue light to be read simultaneously or sequentially. Other types of reflectors could be employed, for example, prisms could be used in place of mirrors. Likewise, the percentages of light reflected by the mirrors or prisms can be adjusted based on the intensity of the light involved or on the needs of a particular application.

Figure 4B:
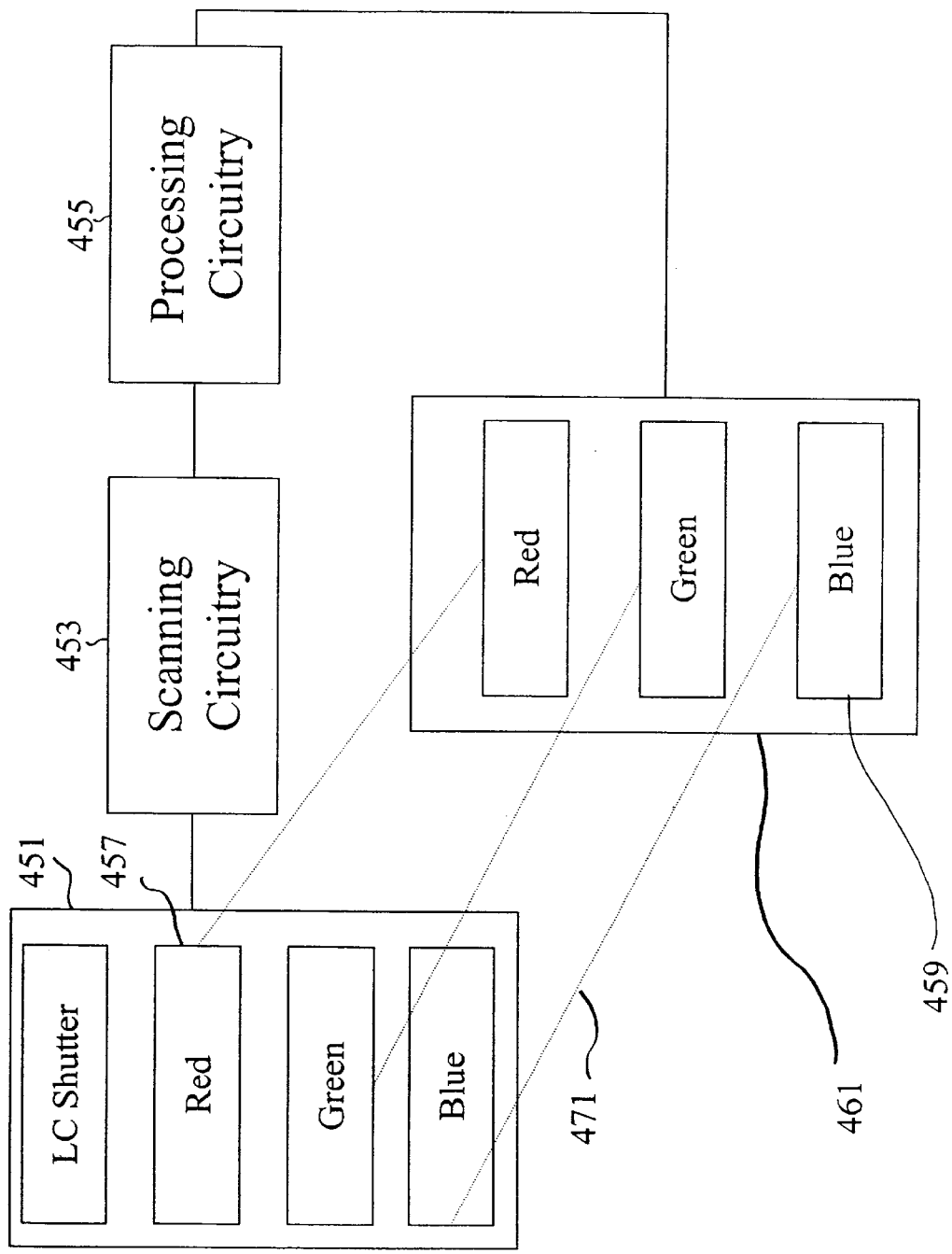
FIG. 4B is a schematic block diagram of an embodiment of the component parts underlying the semiconductor component of FIG. 4A.

FIG. 4B is a schematic block diagram of an embodiment of the component parts underlying the semiconductor component of FIG. 4A. FIG. 4B illustrates a liquid crystal shutter 451, containing a plurality of color filters 457, in this case red, green and blue, integrated with scanning circuitry 453, processing circuitry 455 and a photodetector array 461. The photodetector array comprises a plurality of arrays 459 to correspond to the filters 457 in the liquid crystal shutter 451. Incident light 471 leaves the LC shutter 451, strikes the photodetector array 461 and is controlled by and with the scanning circuitry 453 and the processing circuitry 455.

The color filters can be selected and programmed to filter the incident light in varying degrees and intensities. The filtering levels can be adjusted with the processing circuitry 455 in order to process light of varying quality, intensity, contrast and brightness. Memory devices could be used to store particular settings for particular applications. The processing circuitry 455 in turn controls the scanning circuitry 453. The scanning circuitry can adjust the filtering or scanning rate and, in conjunction with the processing circuitry, could modulate the various filters.

For example, the red filter might need to pass all of the light through, while only 50% of the light needed to pass through the green and blue filters respectively. Other types of filters could be used such as infrared, ultraviolet or clear filters. The entire beamsplitter assembly is compatible with use in various color imaging applications, including cameras, VCR, laser disc players, computer hardware and software systems and other audio/visual equipment.

The above-listed sections and included information are not exhaustive and are only exemplary for semiconductor components such as photodetector arrays and optics assemblies. The particular sections and included information in a given embodiment may depend upon the specific implementation and the included devices and resources.

Although a system and method according to the present invention has been described in connection with the preferred embodiment, it is not intended to be limited to the specific form set forth herein, but on the contrary, it is intended to cover such alternatives, modifications and equivalents as can be reasonably included within the spirit and scope of the invention as defined by the appended claims.

What is claimed is:

1. A semiconductor component that receives incoming light comprising:

an integrated circuit having photodetector circuitry;

a package housing the integrated circuit;

an optics unit, disposed on the package, that provides an optical pathway for the incoming light to the photodetector circuitry of the integrated circuit; and the optics unit modifying the incoming light in the optical pathway to the photodetector circuitry the optics unit including a liquid crystal device that provides shuttering.

2. The semiconductor component of claim 1, the optics unit comprising a beamsplitter assembly.

3. The semiconductor component of claim 1, the optics unit comprising a lensing assembly.

4. The semiconductor component of claim 1, the optics unit comprising a plurality of filters.

5. The semiconductor component of claim 1, the optics unit comprising an aperture.

6. The semiconductor component of claim 1, wherein the optics unit is electrically passive.

7. The semiconductor component of claim 1, wherein the optics unit is electrically active.

8. The semiconductor component of claim 7, further comprising a conductor that electrically couples the optics unit and the integrated circuit.

9. A semiconductor component that receives incoming light comprising:

an integrated circuit;

a package housing the integrated circuit; and an optics unit, disposed on the package, that selectively provides an optical pathway for the incoming light to the integrated circuit the optics unit including a liquid crystal device that provides shuttering.

10. The semiconductor component of claim 9, the liquid crystal device comprising a display.

11. The semiconductor component of claim 9, the optics unit comprising an aperture.

12. A semiconductor component comprising:

an integrated circuit;

a package housing the integrated circuit; and an optics unit, disposed on the package, that interacts with the integrated circuit the optics unit including a liquid crystal device that provides shuttering.

13. The semiconductor component of claim 12, the integrated circuit comprising photodetector circuitry.

14. The semiconductor component of claim 12, the optics unit assisting the package housing in hermetically sealing the integrated circuit.

15. The semiconductor component of claim 12, the optics unit comprising a plurality of modules.

16. The semiconductor component of claim 12, the optics unit comprising a single module.

17. The semiconductor component of claim 12, the integrated circuit comprising shutter drive circuitry.

18. The semiconductor component of claim 12, the integrated circuit comprising image processing circuitry.

19. The semiconductor component of claim 12, the optics unit comprising a liquid crystal panel.

20. The semiconductor component of claim 19, wherein the liquid crystal panel comprises a liquid crystal display.

21. The semiconductor component of claim 19, wherein the liquid crystal panel comprises a liquid crystal shutter.

22. The semiconductor component of claim 12, wherein the optics unit comprises a beamsplitter assembly.

23. The semiconductor component of claim 22, the beamsplitter assembly comprising a filter.

24. The semiconductor component of claim 22, wherein the optics unit is electrically active.

25. The semiconductor component of claim 22, further comprising a conductor that electrically couples the optics unit and the integrated circuit.

26. The semiconductor component of claim 12, wherein the optics unit comprises a lensing assembly.

* * * * *